(12) United States Patent
Liu et al.

(10) Patent No.: US 11,520,434 B2
(45) Date of Patent: Dec. 6, 2022

(54) DISPLAY PANEL AND DISPLAY DEVICE

(71) Applicant: BOE TECHNOLOGY GROUP CO., LTD., Beijing (CN)

(72) Inventors: Lina Liu, Beijing (CN); Dalin Xiang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/334,413

(22) Filed: May 28, 2021

(65) Prior Publication Data

US 2022/0129131 A1 Apr. 28, 2022

(30) Foreign Application Priority Data

Oct. 27, 2020 (CN) .......................... 202011165347.3

(51) Int. Cl.
| | |
|---|---|
| *G06F 3/041* | (2006.01) |
| *G06F 3/044* | (2006.01) |
| *H01L 27/32* | (2006.01) |
| *H01L 51/00* | (2006.01) |
| *H01L 51/52* | (2006.01) |

(52) U.S. Cl.
CPC .......... *G06F 3/04164* (2019.05); *G06F 3/044* (2013.01); *G06F 3/0412* (2013.01); *H01L 27/323* (2013.01); *H01L 27/3244* (2013.01); *H01L 51/0097* (2013.01); *H01L 51/5281* (2013.01); *H01L 2251/5338* (2013.01)

(58) Field of Classification Search
None
See application file for complete search history.

(56) References Cited

U.S. PATENT DOCUMENTS

2020/0363905 A1* 11/2020 Jo ........................ H01L 51/0097

* cited by examiner

*Primary Examiner* — Brian M Butcher
(74) *Attorney, Agent, or Firm* — McCoy Russell LLP

(57) ABSTRACT

A display panel and a display device are provided. The display panel comprises an encapsulation layer and a touch control structure on the encapsulation layer. The encapsulation layer comprises a plurality of pixel opening portions and spacing portions between the pixel opening portions. The touch control structure comprises a first conductive film layer, a second conductive film layer and an insulating layer between the first conductive film layer and the second conductive film layer, wherein the first conductive film layer comprises a plurality of touch control blocks, and the second conductive film layer comprises a plurality of touch control lines and a plurality of dummy lines. At least one dummy line is between adjacent touch control lines of at least some touch control lines. Each touch control block is electrically connected to one of the touch control lines via a conductive element arranged in the insulating layer.

17 Claims, 10 Drawing Sheets

DISPLAY PANEL AND DISPLAY DEVICE

CROSS-REFERENCE TO RELATED APPLICATION

The present application claims priority to Chinese Patent Application No. 202011165347.3 filed on Oct. 27, 2020. The entire contents of the above-listed application is hereby incorporated by reference for all purposes.

TECHNICAL FIELD

The present disclosure relates to the field of display technologies, and in particular, to a display panel and a display device.

BACKGROUND

An OLED (Organic Light Emitting Diode) display screen is a display screen fabricated by an organic electroluminescent diode. Since the organic electroluminescent diode is used, the OLED display screen has excellent characteristics such as not requiring a backlight source, high contrast ratio, small thickness, wide viewing angle, fast reaction speed, applicable in flexible panels, wide usage temperature range, and relatively simple construction and process. The OLED display screen is considered as the next generation of emerging application technologies of planar displays.

Compared with LCD (Liquid Crystal Display) and rigid OLED, flexible OLED has a wider application prospect. Flexible screens are widely applied in mobile phones and tablet personal computers, which require that a touch layer also needs bendable performance, so a current AMOLED flexible screen changes from the out-cell mutual-capacitive structure to an oncell mutual-capacitive structure. The oncell technology refers to a method for embedding a touch screen between a color film substrate and a polarizer of a display screen.

SUMMARY

An embodiment of the present disclosure provides a display panel, comprising an encapsulation layer and a touch control structure on the encapsulation layer. The encapsulation layer comprises a plurality of pixel opening portions and spacing portions between the pixel opening portions. The touch control structure comprises a first conductive film layer, a second conductive film layer and an insulating layer between the first conductive film layer and the second conductive film layer, wherein the first conductive film layer comprises a plurality of touch control blocks, and the second conductive film layer comprises a plurality of touch control lines and a plurality of dummy lines. At least one of the dummy lines is provided between adjacent touch control lines of at least part of the plurality of touch control lines. Each of the touch control blocks is electrically connected to one of the touch control lines via a conductive element arranged in the insulating layer, and the dummy lines are electrically insulated from the touch control lines. At least part of the dummy lines are provided at positions corresponding to the spacing portions.

In some optional embodiments, at least one of the dummy lines is provided at the periphery of each of the touch control lines.

In some optional embodiments, the dummy lines comprise a plurality of first direction lines that are spaced apart and extend substantially perpendicular to the touch control lines.

In some optional embodiments, at least one of the first direction lines is provided at the periphery of each of the touch control lines.

In some optional embodiments, the plurality of first direction lines is arranged at equal intervals.

In some optional embodiments, the dummy lines comprise a plurality of second direction lines that are arranged substantially parallel to or coaxial with an extension direction of the touch control lines.

In some optional embodiments, at least one of the second direction lines is provided at the periphery of each of the touch control lines.

In some optional embodiments, the plurality of second direction lines is arranged at equal intervals.

In some optional embodiments, the dummy lines comprise a plurality of second direction lines arranged substantially parallel to or coaxial with an extension direction of the touch control lines, and at least some of the first direction lines are connected to each other via a corresponding one of the second direction lines.

In some optional embodiments, at least one of the first direction lines and at least one of the second direction lines are arranged at the periphery of each of the touch control lines.

In some optional embodiments, an arrangement area of at least part of the dummy lines is divided into a plurality of area blocks, and a position and a shape of at least part of the area blocks respectively correspond to a position and a shape of the touch control blocks.

In some optional embodiments, orthographic projections of the touch control lines and the dummy lines onto the encapsulation layer are located within the spacing portions of the encapsulation layer.

In some optional embodiments, a shape of a pattern formed by each of the touch control lines and dummy lines at the periphery of the touch control line corresponds to a shape of a corresponding one of the pixel opening portions.

In some optional embodiments, the touch control lines and the dummy lines are provided at positions corresponding to at least 30% of all the spacing portions of the display panel.

In some optional embodiments, each of the touch control blocks is of a grid structure, and comprises grid lines connected with each other, and a grid opening between the grid lines, wherein a position and a shape of the grid opening respectively correspond to a position and a shape of a corresponding one of the pixel opening portions.

In some optional embodiments, at least some grid openings are larger in size than the pixel opening portions.

In some optional embodiments, the grid structure is not provided with a grid line at at least part of positions where the grid structure overlaps the touch control lines.

An embodiment of the present disclosure further discloses a display device, comprising the display panel according to any of the above embodiments.

BRIEF DESCRIPTION OF THE DRAWINGS

In order to more clearly explain technical solutions of embodiments of the present disclosure, drawings required for the description of the embodiments of the present disclosure will be briefly described below. Obviously, the drawings in the following description are only some embodiments of the present disclosure, and for those of ordinary skill in the art, other drawings can be obtained based on these drawings without creative efforts.

DETAILED DESCRIPTION

Figure 1:
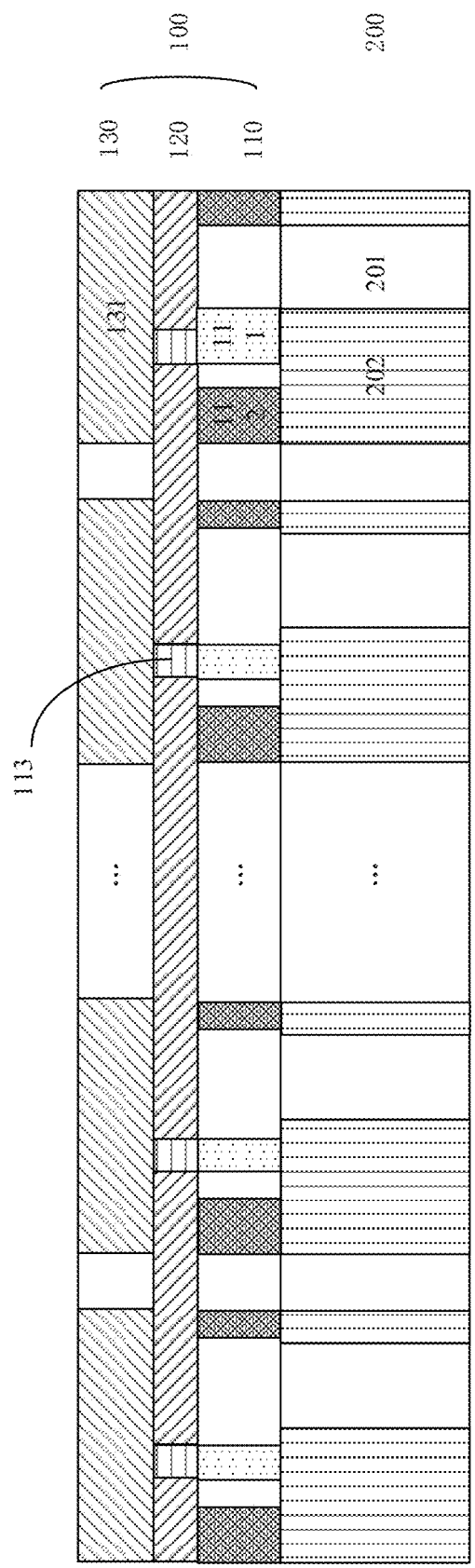
FIG. 1 is a structural diagram of a display panel according to an embodiment of the present disclosure.

Exemplary embodiments of the present disclosure will be described in more detail below with reference to the accompanying drawings. Although exemplary embodiments of the present disclosure are shown in the drawings, it should be understood that the present disclosure may be implemented in various forms and should not be limited by the embodiments set forth herein. Conversely, these embodiments are provided in order to enable a more thorough understanding of the present disclosure and to fully convey the scope of the present disclosure to those of ordinary skill in the art.

Such terms as "first", "second", and the like in the specification of this application are used to distinguish similar objects without having to describe a particular order, sequence or importance. Furthermore, such terms as "include" and "comprise" and any variant thereof are intended to cover non-exclusive inclusion, for example, processes, methods, systems, products or devices that include a series of steps or units are not necessarily limited to those clearly listed, but may include other steps or units that are not clearly listed or inherent to these processes, methods, products or devices. Such terms as "up", "down", "left", "right", "inner", "outer", "top", "bottom" and the like are only used to represent a relative positional relationship that may change accordingly when the absolute position of a described object changes.

The oncell mutual-capacitive structure is relatively close to a cathode of the AMOLED screen. As the size of the panel becomes larger, and a cover plate becomes thinner, a parasitic capacitance of the mutual capacitance design may become larger and the signal-to-noise ratio (SNR) of the touch may become worse, which requires a higher capability of an integrated circuit (IC) of the AMOLED flexible screen to detect a touch position of a finger. The oncell self-capacitive structure does not have this problem, because it has a scanning principles different from the oncell mutual-capacitive structure. Therefore, large-sized FMLOC (Flexible Multi-Layer On Cell) structure is preferred to adopt the oncell mutual-capacitive structure at present.

However, each self-capacitive touch control unit has a touch control signal line to be connected to the IC, and it is found that the touch control signal lines are clearly visible after the manufacture of a sample is completed, which adversely affects the screen image.

As shown in FIG. 1, an embodiment of the present disclosure provides a display panel. The display panel comprises an encapsulation layer 200 and a touch control structure 100 arranged on the encapsulation layer 200. The encapsulation layer 200 comprises a plurality of pixel opening portions 201 and spacing portions 202 located between the pixel opening portions 201. The touch control structure 100 comprises a first conductive film layer 130, a second conductive film layer 110, and an insulating layer 120 arranged between the first conductive film layer 110 and the second conductive film layer 130. The first conductive film layer 130 comprises a plurality of touch control blocks 131, and the second conductive film layer 110 comprises touch control lines 111 and dummy lines 112, and the dummy lines 112 are insulated from the touch control lines 111. The touch control line 111 is electrically connected to the touch control block 131 via a conductive element 113 arranged in the insulating layer 120. Optionally, the dummy line 112 is provided at a position corresponding to the spacing portion 202.

In a particular embodiment, orthographic projections of the dummy lines 112 onto the encapsulation layer 200 fall within the spacing portions 202 of the encapsulation layer 200.

Figure 2:
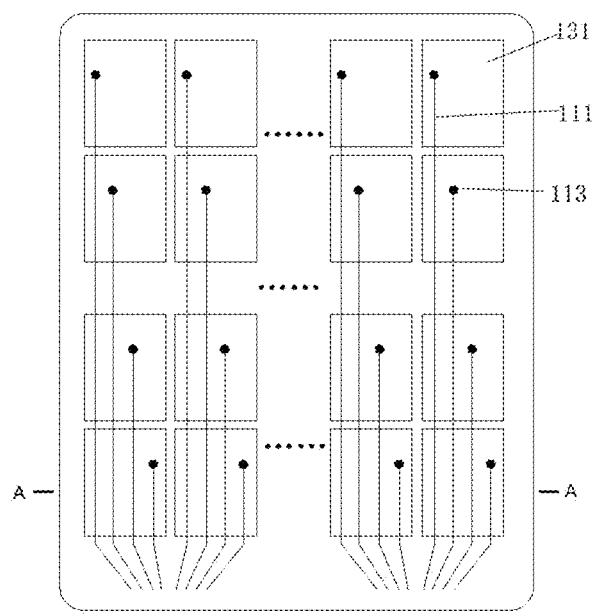
FIG. 2 is a top view of a touch control structure according to an embodiment of the present disclosure.
Figure 3:
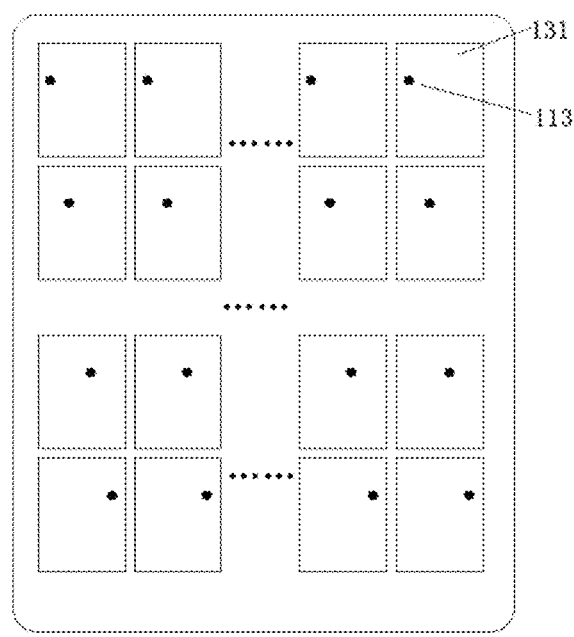
FIG. 3 is a top view of a first conductive film layer according to an embodiment of the present disclosure.
Figure 4:
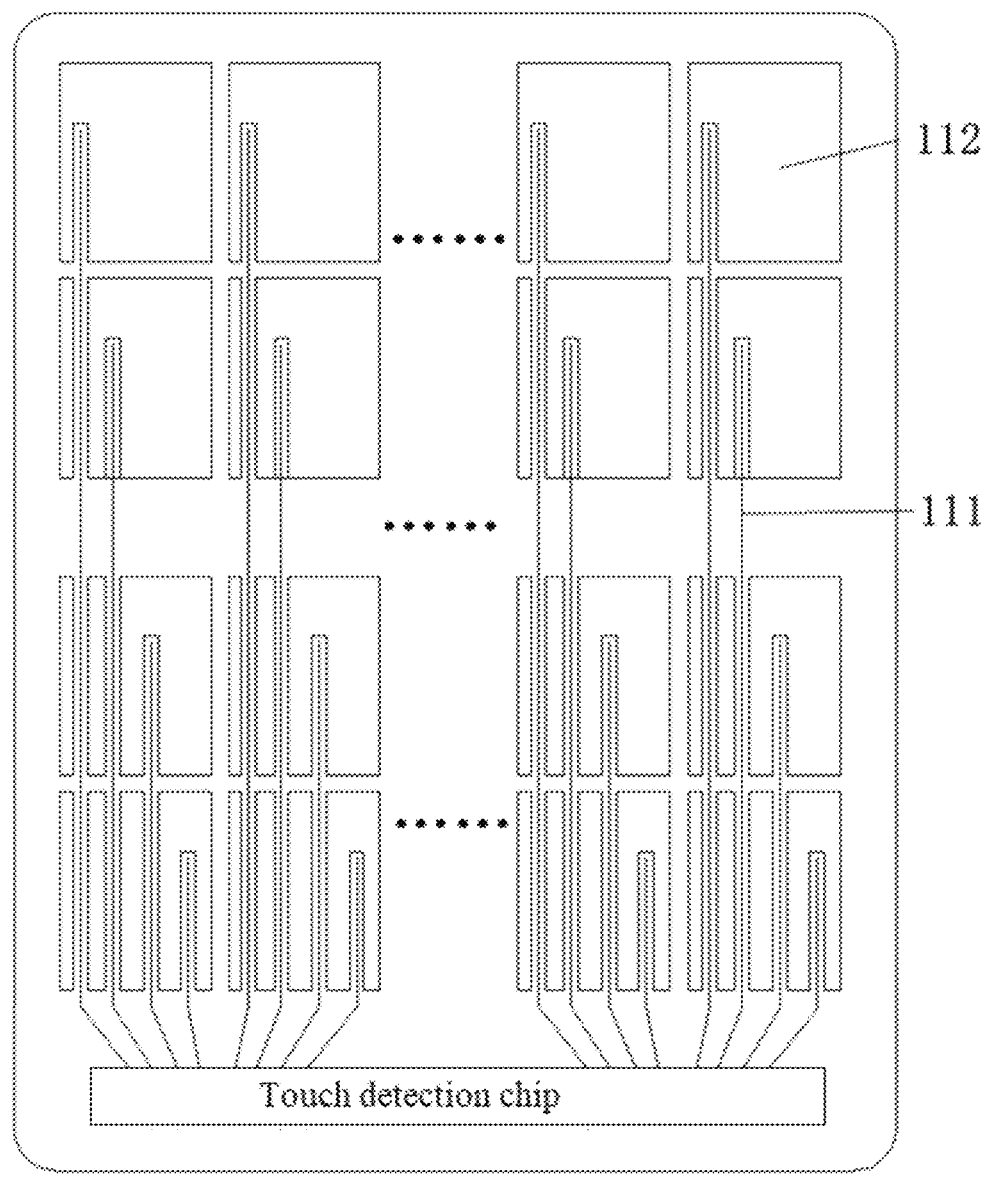
FIG. 4 is a top view of a second conductive film layer according to an embodiment of the present disclosure.

FIG. 2 is a top view of a touch control structure according to an embodiment of the present disclosure. FIG. 3 is a top view of a first conductive film layer according to an embodiment of the present disclosure. FIG. 4 is a top view of a second conductive film layer according to an embodiment of the present disclosure. FIG. 2 to FIG. 4 are only specific embodiments for showing structural diagrams of elements in a touch control structure. In some other embodiments, elements in a touch control structure may have other arrangements.

As shown in FIG. 3, the first conductive film layer 130 comprises a plurality of touch control blocks 131 arranged in an array with multiple rows and multiple columns (four rows and four columns are shown in FIG. 3, and in practical applications, the number of rows and columns of the touch control blocks can be set according to practical situations). In FIG. 3, the plurality of touch control blocks 131 are rectangular, it may be understood that the touch control block may have other shapes. Each touch control block 131 is connected to a corresponding touch control line 111 in the second conductive film layer 110 via a conductive element 113. In a specific embodiment, the touch control block may include a touch control electrode block for sensing or detecting a touch control signal, the conductive element is a conductive metal block, or made of other conductive materials.

As shown in FIG. 4, a plurality of touch control lines on the second conductive film layer 110 are extended and connected to a touch detection chip. The dummy line 112 is insulated around the touch control line 111. In FIG. 4, an area where the dummy lines 112 of the second conductive film layer 110 are arranged is divided into a plurality of area blocks, a position and a shape of at least some of the area blocks correspond to a position and a shape of the corresponding touch control block 131 on the first conductive film layer 130, and the dummy lines 112 are arranged in the area blocks.

As shown in FIG. 4, the touch control lines 111 extend along the long side of the display panel and are connected to the touch detection chip. In the path extending to the touch detection chip, the touch control line 111 passes through a plurality of area blocks where the dummy lines 112 are provided. By taking an area block in the lower left corner of FIG. 4 as an example, the area block corresponds to four touch control lines 111, wherein three touch control lines 111 on the left side completely pass through the area block, and the area block is divided into four parts; one touch control line 111 on the far right side extends from a certain position in the area block to the touch detection chip, and the area block is partially divided. The touch control blocks shown schematically in FIG. 4 have four rows, and there are four touch control lines 111 distributed in each area block of the last row (i.e., the fourth row), which indicates that the number of touch control lines in each area block is equal to the row number where the area block is located. In actual situations, there are N touch control lines within each area block of a certain row, and N is equal to the row number of the certain row.

It should be noted that the multiple area blocks of the dummy lines may be virtual logical areas for illustration and understanding, or may be specific rectangle structures. For example, an area of the area block where the dummy line 112 is not set is blank. As another example, the plurality of area blocks are a rectangle base layer, and the dummy line 112 of the present disclosure is provided on the base layer.

In an embodiment, the dummy line 112 is arranged at both sides of each touch control line 111.

In an embodiment, positions of the touch control line 111 and the dummy line 112 corresponds to a position of the spacing portion 202.

In an embodiment, at least one dummy line 112 is disposed at the periphery of each of the touch control lines 111.

Figure 9:
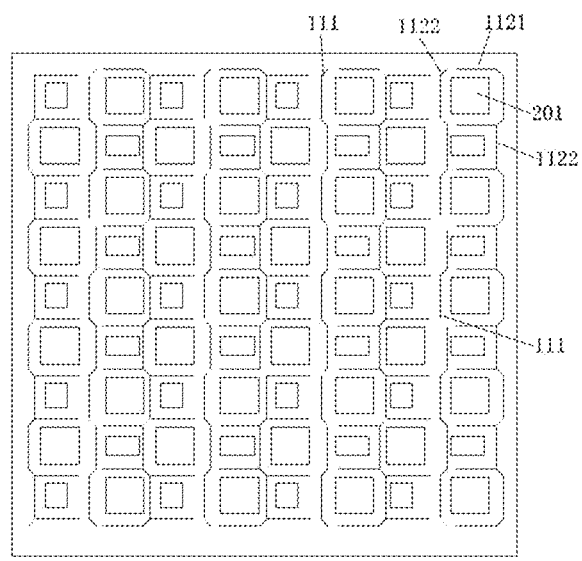
FIG. 9 is an overlay chart of FIG. 7 and FIG. 8.

As shown in FIG. 9, both orthographic projections of the touch control line 111 and the dummy line 112 onto the encapsulation layer 200 are located within the spacing portion 202 of the encapsulation layer 200 and outside the pixel opening portion 201 of the encapsulation layer 200.

Figure 5:
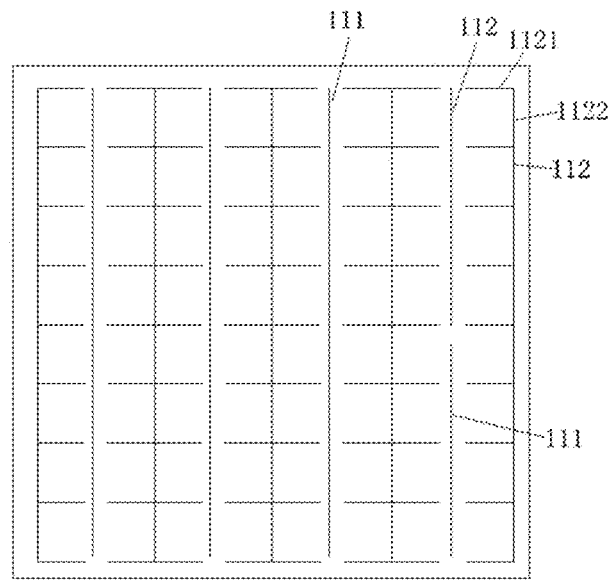
FIG. 5 is a partial view of a second conductive film layer according to an embodiment of the present disclosure.

In an optional embodiment, as shown in FIG. 5, the dummy lines 112 comprise a plurality of first direction lines 1121 that are spaced apart and extend substantially perpendicular to the touch control lines 111.

In an optional embodiment, as shown in FIG. 5, the dummy lines 112 include a plurality of second direction line 1122 that are arranged substantially parallel to or coaxial with an extension direction of the touch control lines 111.

In an embodiment, a shape of an opening pattern surrounded by the touch control line 111 and the dummy line 112 corresponds to a shape of the pixel opening portion 201. As shown in FIG. 9, the first direction lines 1121 of the touch control lines 111 and the dummy lines 112 form a quadrangle of an opening, the quadrangle corresponding to the shape of the corresponding pixel opening portion 201, and is located around the pixel opening portion 201.

With such a solution, a plurality of first direction lines perpendicular to the touch control lines 111 are formed on the second conductive film layer 110, and the dummy lines are distributed in the area at the periphery of the touch control line 111, so that the distribution of the touch control lines 111 is no longer abrupt, and the touch control lines are not obviously visible as compared with the method in the relevant technology where the area around the touch control lines is blank, thus improving the visual effect.

In FIG. 1, the touch control block 131 is located on the touch control line 111 and the dummy line 112, and in practice, the touch control block 131 may also be located below the touch control line 111 and the dummy line 112.

FIG. 5 shows a distribution of touch control lines 111 and dummy lines 112 in an area block according to an embodiment, where details of dummy lines 112 are shown. As shown in FIG. 5, the first direction line 1121 and the second direction line 1122 are intersected, and multiple first direction lines 1121 and at least one second direction line 1122 are provided in a surrounding area or periphery of each of the four touch control lines 111 in one area block. In this way, the four touch control lines 111 are hidden in the intersected first direction lines 1121 and second direction lines 1122, so that the touch control lines and the dummy lines are evenly distributed in the whole area blocks, thereby improving the visual effect.

In an optional embodiment, the plurality of first direction lines 1121 are equally spaced in the extension direction of the touch control line.

In an optional embodiment, the plurality of second direction lines 1122 are equally spaced in the extension direction of the touch control line.

As shown in FIG. 5, the second direction line 1122 is provided on both sides of each touch control line 111, and one second direction line 1122 intersects with multiple first direction lines 1121. As shown on the upper right side of FIG. 5, a second direction line 1122 is distributed coaxially with the touch control line that does not pass completely through the area block, which makes the wiring distribution throughout the second conductive film layer 110 more uniform.

Figure 6:
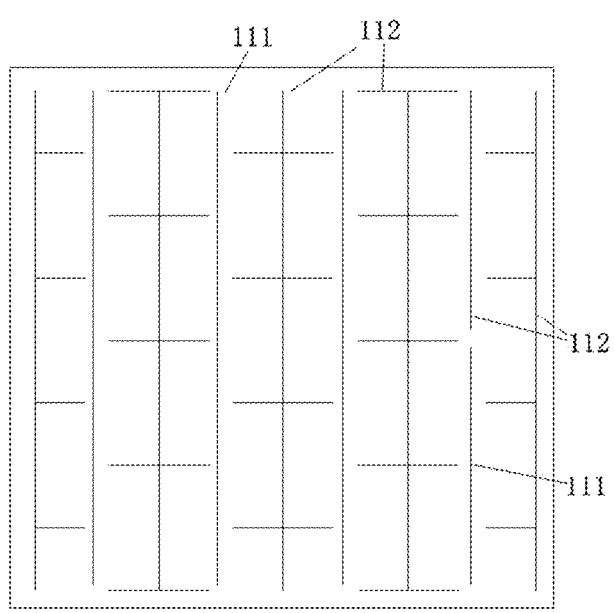
FIG. 6 is a partial view of a second conductive film layer according to another embodiment of the present disclosure.

In an embodiment, as shown in FIG. 6, the first direction lines 1121 are connected by the second direction line 1122. Specifically, one second direction line 1122 is used between any two adjacent touch control lines 111 to connect multiple first direction lines 1211. A plurality of mutually parallel second direction lines 1122 may also be used between any two adjacent touch control lines 111, and the specific number of the second direction lines 1122 may be designed according to actual situations, for example, designing the number according to the spacing of the first direction lines 1121. For example, the spacing of the first direction lines 1121 is the same as or similar to the spacing of the second direction lines 1122. In another embodiment, each of the second direction lines 1122 may be divided into a plurality of coaxially spaced second direction lines.

In the above embodiments, each of the first direction line 1121 and the second direction line 1122 has a straight line structure, and a serrated line, a wavy line, a Great Wall line or the like extending in the first direction and the second direction may also be used.

Figure 7:
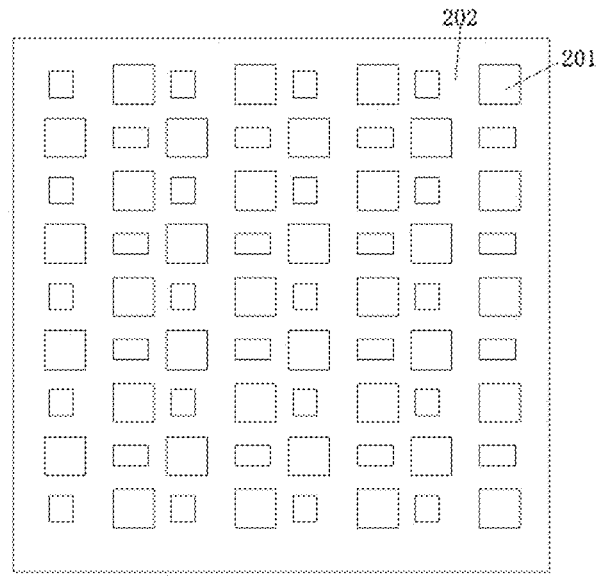
FIG. 7 is a partial top view of an encapsulation layer according to an embodiment of the present disclosure.
Figure 8:
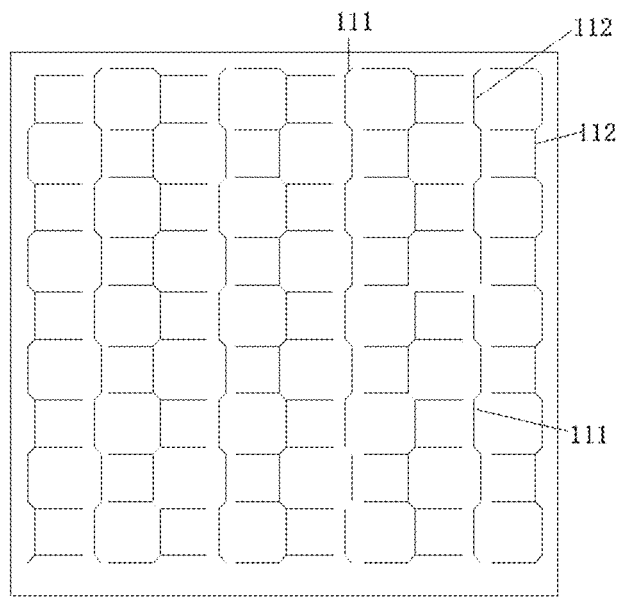
FIG. 8 is a partial view of a second conductive film layer according to another embodiment of the present disclosure.

In an embodiment, as shown in FIG. 7 to FIG. 13, the arrangement of the dummy lines 112 is optimized for better display. Specifically, as shown in FIG. 7, in a display device, the touch control structure 100 is arranged on an encapsulation layer 200, and the encapsulation layer 200 comprises a plurality of pixel opening portions 201 and spacing portions 202 between the pixel opening portions 201 (which are, for example, openings and spacers between the openings on a pixel definition layer (PDL)), where the pixel opening portions 201 are used for exposing underlying light-emitting sub-pixels, such as RGB sub-pixels). As shown in FIG. 8 and FIG. 9, each of the touch control line 111 and the dummy line 112 is provided at a position corresponding to the spacing portion 202, i.e. keeping away from the pixel opening portion 201. In such a manner, the light emitted from the RGB sub-pixels is not blocked by the touch control lines 111 or the dummy lines 112 on the sub-pixels, so that a better display effect can be achieved.

In this case, since the sizes of sub-pixels in various rows and columns are not the same, the spacing portions 202 between adjacent rows and adjacent columns of sub-pixels do not align, resulting in that the first direction line 1121 and the second direction line 1122 are not straight lines, but are bend lines adapted to a bent structure of the spacing portion 202 (as shown in FIG. 9 to FIG. 13, the touch control line 111 and the dummy line 112 are Great Wall lines).

As stated above, the touch control lines 111, the first direction lines 1121 and the second direction lines 1122 are arranged according to the shape of the spacing portion 202. Therefore, in the case of different sizes and arrangements of a sub-pixel, the shape of the spacing portion 202 may also be different, and shapes of the touch control line 111, the first direction line 1121 and the second direction line 1122 may also be adaptively adjusted. The present disclosure is not limited to several line shapes as described above.

In FIG. 8 and FIG. 9, a touch control line 111 and/or a dummy line 112 are provided at a position corresponding to a spacing portion 202 between any two adjacent pixel opening portions 201, and thus the touch control line 111 and/or the dummy line 112 are provided around each pixel opening 202, the touch control line 111 and the dummy line 112 form a pattern surrounding each of the pixel opening portions 201. Since there is a disconnected insulation structure between the touch control line 111 and the dummy line 112, when a certain pixel opening portion is surrounded by a pattern formed by the touch control line 111 and the dummy line 112 together, the pattern is not a closed structure. Of course, when the dummy lines 112 is arranged at all the peripheries of a certain pixel opening portion 201, a pattern surrounded by the dummy lines 112 may be a closed structure.

With such a solution, lines are provided on the second conductive film layer 110 at positions corresponding to the periphery of each pixel opening portion 201, so that the line distribution of the whole second conductive film layer 110 is relatively uniform, and the touch control lines 111 are well hidden in the dummy lines 112, so that the touch control line 111 is less obvious than the periphery of the touch control line 111, thereby improving the visual effect.

As shown in FIG. 10 to FIG. 13, a touch control line 111 and/or a dummy line 112 are provided on the second conductive film layer 110 at a position corresponding to some spacing portions 202 between adjacent pixel opening portions 201, and the touch control line 111 and the dummy line 112 are not provided at the position corresponding to other spacing portions 202. Thus, for four edges around the corresponding part of the pixel opening portion 201, only a part of the edges are provided with the touch control line 111 and/or the dummy line 112, i.e. the touch control line 111 and/or the dummy line 112 do not form an enclosing structure, but are partially enclosed.

With such a solution, the touch control line 111 is better hidden in the dummy line 112, so that the touch control line 111 is less obvious than the surrounding of the touch control line 111, thereby improving the visual effect, at the same time, reducing the number of dummy lines 112, and saving the manufacturing cost and process time. In an optional embodiment, the touch control lines and the dummy lines are provided at positions corresponding to at least 30% of all the spacing portions of the display panel, which can achieve a relatively good visual effect.

Figure 10:
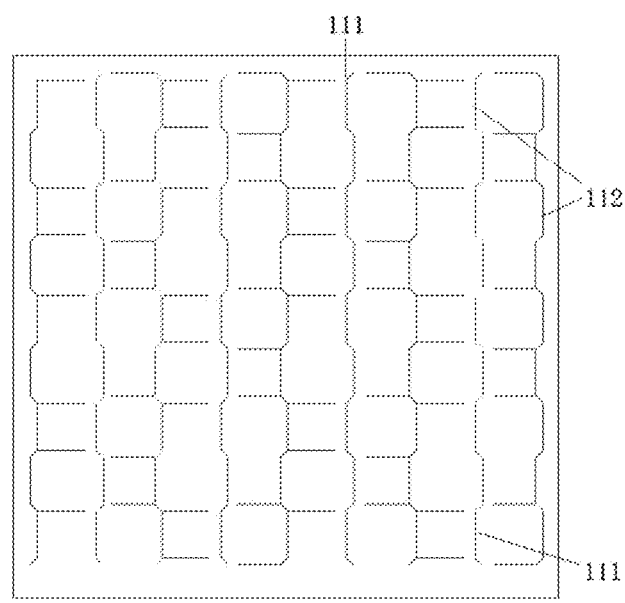
FIG. 10 is a partial view of a second conductive film layer according to another embodiment of the present disclosure.

Specifically, as shown in FIG. 10, four pixel opening portions 201 from the first row and the first column to the second row and the second column are divided into a group, and the touch control line 111 and the dummy lines 112 at the periphery of each of the four pixel opening portions 201 in this group constitute a partially surrounding structure; four adjacent pixel opening portions 201 from the first row and the third column to the second row and the fourth column are divided into another group, and the touch control line 111 and the dummy lines 112 at the periphery of each of the four pixel opening portions 201 in the group constitute a nearly surrounding structure with only two openings for insulation; and similarly, such two groups are alternately distributed in two directions. For example, in FIG. 10, a partially surrounding structure with three sides (where one side is a touch control line 111 and the other two sides are two dummy lines 112) is arranged at the periphery of or surrounding each of four pixel opening portions 201 in the upper left corner. For four adjacent pixel opening portions 201, a nearly surrounding structure with four sides (where one side is a touch control line 111 and the other three sides are three dummy lines 112) is arranged surrounding each of the four pixel opening portions 201 from the first row and the third column to the second row and the fourth column. For four pixel opening portions 201 at the upper right corner in FIG. 10, each of the four pixel opening portions 201 is surrounded by a nearly surrounding structure with four sides, and all the four sides are dummy lines 112. For four pixel opening portions 201 below from the third row and the seventh column to the fourth row and the eighth column, each of the four pixel opening portions 201 is surrounded by a partially surrounding structure with three sides, and all the three sides are dummy lines 112.

In this configuration, the touch control line 111 and the dummy line 112 are provided at positions corresponding to 87.5% of all the spacing portions 202.

Figure 11:
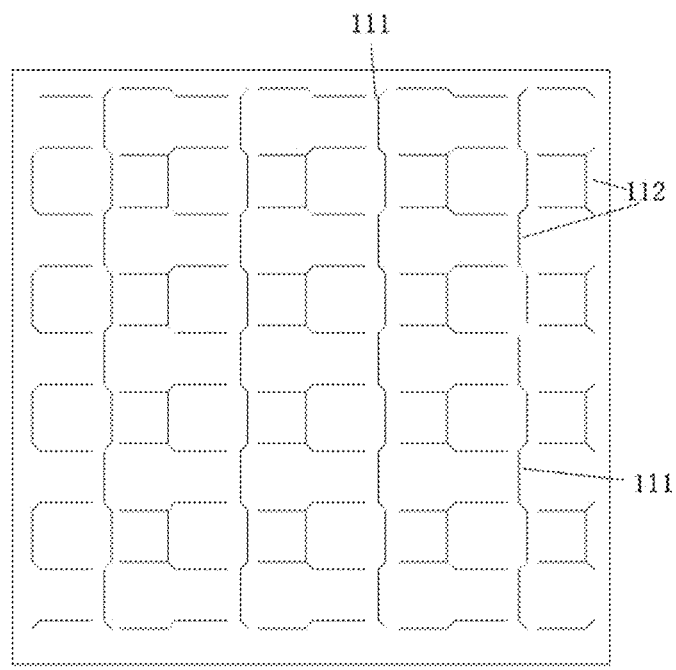
FIG. 11 is a partial view of a second conductive film layer according to another embodiment of the present disclosure.

As shown in FIG. 11, each pixel opening portion 201 in a row is partially surrounded by a partially surrounding structure with three sides, and the three sides are a touch control line 111 and/or a dummy line 112; each pixel opening portion 201 in the next row is surrounded by a surrounding structure with four sides, and the four sides are a touch control line 111 and/or a dummy line 112; and two rows are alternately distributed.

This configuration is similar as the configuration in FIG. 10, and in this configuration, the touch control line 111 and the dummy line 112 are provided at positions corresponding to 87.5% of all the spacing portions 202.

Figure 12:
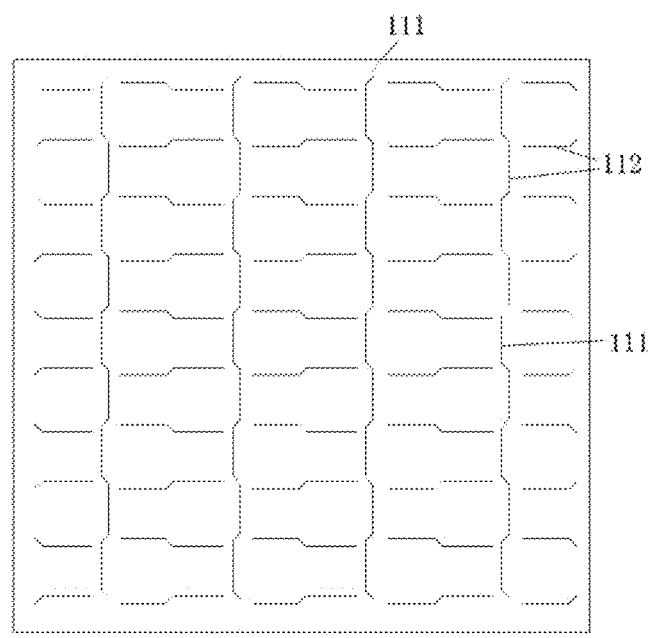
FIG. 12 is a partial view of a second conductive film layer according to another embodiment of the present disclosure.

As shown in FIG. 12, each pixel opening portion 201 is partially surrounded by a partially surrounding structure with three sides, where the three sides are the dummy lines, or one side is the touch control line and the other two sides are the dummy lines. In this configuration, the touch control line 111 and the dummy line 112 are provided at positions corresponding to 75% of all the spacing portions 202.

Figure 13:
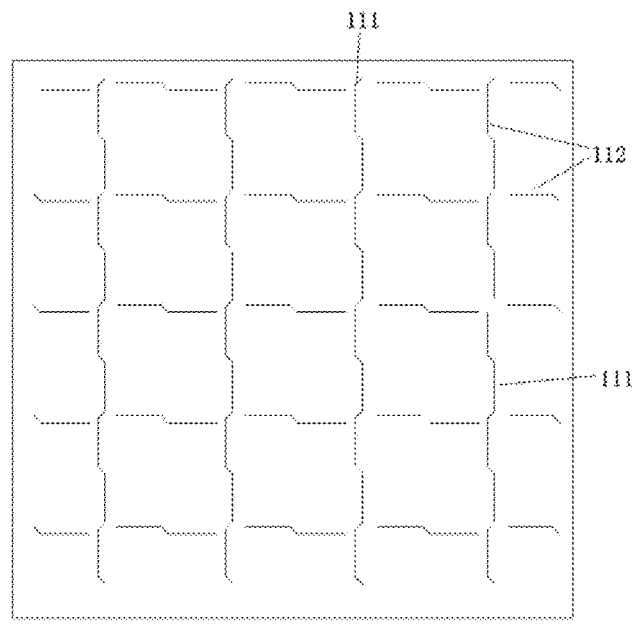
FIG. 13 is a partial view of a second conductive film layer according to another embodiment of the present disclosure.

As shown in FIG. 13, each pixel opening portion 201 is partially surrounded by a partially surrounding structure with two sides, where the two sides are the dummy lines, or one side is the touch control line and the other side is the dummy lines. In this configuration, the touch control line 111 and the dummy line 112 are provided at positions corresponding to 50% of all the spacing portions 202.

In FIG. 10 to FIG. 13, the second direction line 1122 is not used between two adjacent touch control lines 111 to connect multiple first direction lines 1121 between the two adjacent touch control lines 111, or one second direction line 1122 is used between two adjacent touch control lines 111 to connect multiple first direction lines 1121 between the two adjacent touch control lines 111. It should be understood that when a distance between two adjacent touch control lines 111 is equal to the sum of widths of more than two pixel opening portions 201. For example, in a case that the distance between two adjacent touch control lines 111 corresponds to four pixel opening portions 201, there is one spacing portion 202 between every two pixel opening portions 201, and there is a total of three spacing portions 202, and in this case, two or three second direction lines 1122 may be provided between two adjacent touch control lines 111. In this way, in practice, the touch control line 111 and/or the dummy line 112 can be provided at fewer positions corresponding to the spacing portions 202, and it has been found by experiments that the objective of the present application can be basically achieved and a predetermined effect can be achieved by providing the touch control line 111 and the dummy line 112 at positions corresponding to more than 30% of the all spacing portions 202. In another optional embodiment, the touch control lines and the dummy lines are provided at positions corresponding to at least 50% of all the spacing portions of the display panel. In another optional embodiment, the touch control lines and the dummy lines are provided at positions corresponding to at least 90% of all the spacing portions of the display panel. Of course, one premise of setting the ratio 30%, 50%, or 90% herein, the overall arrangement of the touch control lines 111 and the dummy lines 112 is relatively uniform, which excludes the case that the touch control lines and the dummy lines are provided at positions corresponding to a certain ratio of all the spacing portions of the display panel, and not provided at positions corresponding to the remaining spacing portions. In an optional embodiment, by taking 20*20 pixels as a group, the arrangement amount of the touch control line 111 and the dummy line 112 in a group is basically the same as the arrangement amount of the touch control line 111 and the dummy line 112 in any other group, and the difference is within 20%.

Figure 14:
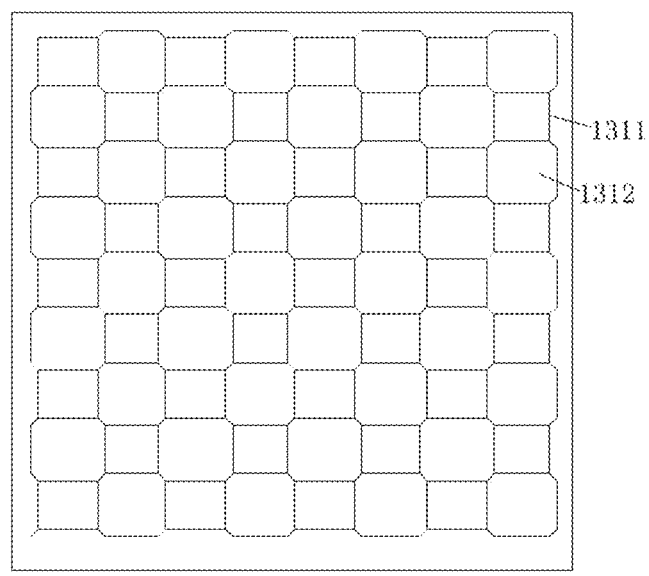
FIG. 14 is an enlarged view of a touch control block according to another embodiment of the present disclosure.
Figure 15:
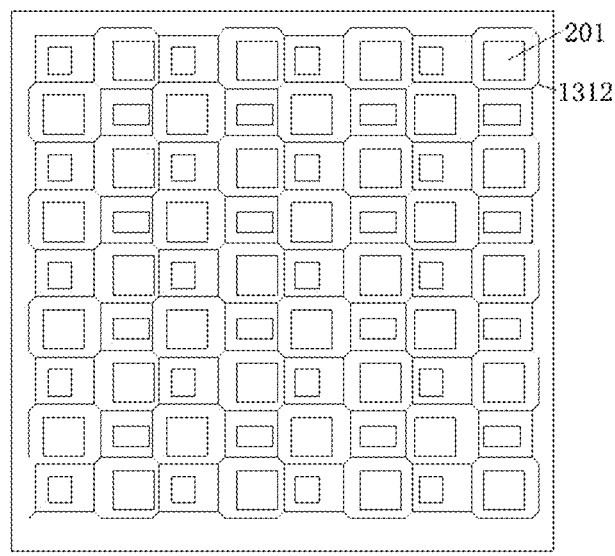
FIG. 15 is an overlay chart of FIG. 14 with an encapsulation layer.

As shown in FIG. 14 and FIG. 15, in an embodiment, each touch control block 131 of the first conductive film layer 130 is of a grid structure, which includes grid lines 1311 connected with each other and a grid opening 1312 between the grid lines 1311. Optionally, as shown in FIG. 13, a position and a shape of the grid opening 1312 correspond to a position and a shape of a corresponding one of the pixel opening portions 201. Optionally, the size of at least part of the grid openings 1312 is slightly larger than the size of the pixel opening portion 201. With such a solution, the interconnected grid lines 1311 can achieve good detection of a touch, and since the position and the shape of the grid openings 1312 correspond to the position and the shape of the pixel opening portions 201, the light emitted by pixels is not blocked, and the display effect is improved.

Figure 16:
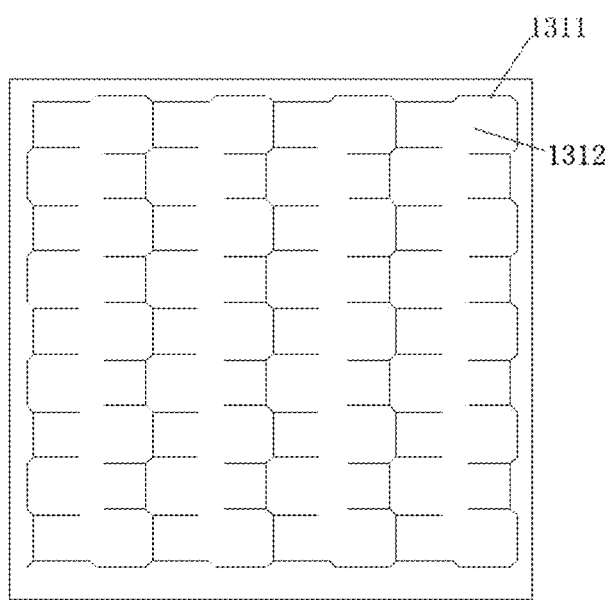
FIG. 16 is an enlarged view of a touch control block according to another embodiment of the present disclosure.

As shown in FIG. 16, in an embodiment, in order to reduce the interference (e.g. a parasitic capacitance) between the grid line 1311 and the touch control line 111 on the second conductive film layer 110 that are in usage, the grid structure is not provided with a grid line at least part of positions where the grid structure overlaps the touch control lines, and the overlapping means that the lines of the second conductive film layer overlaps with orthographic projections of the lines of the first conductive film layer onto the second conductive film layer, for example, forming a blank by way of disconnection. As compared FIG. 14, FIG. 12 with FIG. 5, it can be seen from most of the positions corresponding to the touch control line 111 in FIG. 5 and FIG. 14 are blank. Of course, in order to achieve the connection of the whole grid lines, the outermost grid lines in the FIG. 5 and FIG. 14 are not disconnected, and it is only necessary to disconnect at a position, and may also disconnect at some other intermediate positions).

With such a scheme, the grid line 1311 of the first conductive film layer 130 and the touch control line 111 of the second conductive film layer 110 do not overlap as much as possible, thus avoiding the generation of capacitance therebetween, reducing the generation of touch interference and improving the detection accuracy.

Figure 17:
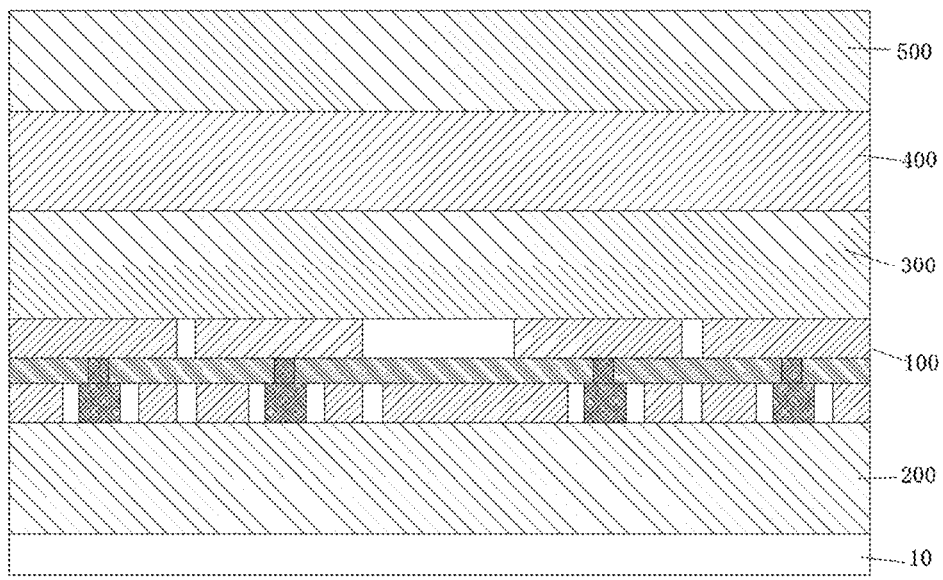
FIG. 17 is a structural diagram of a display panel according to another embodiment of the present disclosure.

Another embodiment of the present disclosure provides a display panel, as shown in FIG. 17, which comprises a substrate 10, and an encapsulation layer (TFE) 200, a touch structure 100, a circular polarizer (CPOL) 300, an optical adhesive layer (OCA) 400, and a cover plate 500 that are laminated on the substrate 10 in order.

The touch control structure 100 adopts the touch control structure of any of the above-mentioned embodiments.

In an implementation, the encapsulation layer 200 includes a plurality of RGB sub-pixels and a pixel defining layer, and pixel opening portions 201 and a spacing portions 202 are formed in the pixel defining layer.

In an embodiment, the touch control line 111 and the dummy line 112 of the touch structure 100 are disposed at positions corresponding to the spacing portions 202 of the encapsulation layer 200.

In an embodiment, each touch control block 131 of the first conductive film layer 130 is of a grid structure, which includes grid lines 1311 connected with each other and a grid opening 1312 between the grid lines 1311, as shown in FIG. 14. Optionally, a position and a shape of the grid opening 1312 correspond to a position and a shape of a corresponding one of the pixel opening portions 201. Optionally, as shown in FIG. 15, the size of at least part of the grid openings 1312 is slightly larger than the size of the pixel opening portion 201. With such a solution, the interconnected grid lines 1311 can achieve good detection of a touch, and since the position and the shape of the grid openings 1312 correspond to the position and the shape of the pixel opening portions 201, the light emitted by pixels is not blocked, and the display effect is improved.

Embodiments of the present disclosure also provide a display device including the touch control structure 100 or the display panel according to any of the above embodiments.

In an embodiment, each of materials of the first conductive film layer 130 and the second conductive film layer 110 includes a metallic material such as copper or a conductive non-metallic material such as indium tin oxide (ITO).

In an embodiment, the line width of the touch control line 111 ranges from 2 microns to 4 microns, and the width of the spacer ranges from 12 microns to 20 microns.

In an embodiment, the width of an opening between two adjacent dummy lines 112 ranges from 4 microns to 6 microns.

In an embodiment, a minimum distance between the touch control line 111 and the adjacent dummy line 112 ranges from 1 microns to 2 microns.

Optional implementations of the present disclosure are described above. It should be noted that, numerous modifications and improvements may be made by a person of ordinary skill in the art without departing from the principle of the present disclosure, and these modifications and improvements shall fall also within the protection scope of the present disclosure.

What is claimed is:

1. A display panel, comprising an encapsulation layer and a touch control structure on the encapsulation layer, wherein the encapsulation layer comprises a plurality of pixel opening portions and spacing portions between the pixel opening portions,
   wherein the touch control structure comprises a first conductive film layer, a second conductive film layer and an insulating layer between the first conductive film layer and the second conductive film layer in a direction from the encapsulation layer to the touch control structure and perpendicular to the encapsulation layer, the first conductive film layer, the second conductive film layer and the insulating layer are at different layers in the direction from the encapsulation layer to the touch control structure and perpendicular to the encapsulation layer, wherein the first conductive film layer comprises a plurality of touch control blocks, and the second conductive film layer comprises a plurality of touch control lines and a plurality of dummy lines,
   at least one of the dummy lines is provided between adjacent touch control lines of at least part of the plurality of touch control lines,
   each of the touch control blocks is electrically connected to one of the touch control lines via a conductive element arranged in the insulating layer, and the dummy lines are electrically insulated from the touch control lines, and
   at least part of the dummy lines are provided at positions corresponding to the spacing portions,
   wherein an arrangement area of at least part of the dummy lines is divided into a plurality of area blocks, and a position and a shape of at least part of the area blocks respectively correspond to a position and a shape of the touch control blocks, and an orthogonal projection of each touch control block onto the encapsulation layer overlaps an orthogonal projection of at least one of the dummy lines of an area block corresponding to the touch control block onto the encapsulation layer;
   wherein the area blocks are arranged in columns and rows, a touch detection chip is arranged at a side of the display panel, the quantities of the touch control lines arranged in the area blocks in a same column and the rows away from the chip gradually decreases, and the quantity of the touch control lines in each of area blocks in a last row away from the chip is the smallest and equal to 1.

2. The display panel according to claim 1, wherein at least one of the dummy lines is provided at the periphery of each of the touch control lines.

3. The display panel according to claim 1, wherein the dummy lines comprise a plurality of first direction lines that are spaced apart and extend substantially perpendicular to the touch control lines.

4. The display panel according to claim 3, wherein at least one of the first direction lines is provided at the periphery of each of the touch control lines.

5. The display panel according to claim 3, wherein the plurality of first direction lines is arranged at equal intervals.

6. The display panel according to claim 1, wherein the dummy lines comprise a plurality of second direction lines that are arranged substantially parallel to or coaxial with an extension direction of the touch control lines.

7. The display panel according to claim 6, wherein at least one of the second direction lines is provided at the periphery of each of the touch control lines.

8. The display panel according to claim 6, wherein the plurality of second direction lines is arranged at equal intervals.

9. The display panel according to claim 3, wherein the dummy lines comprise a plurality of second direction lines arranged substantially parallel to or coaxial with an extension direction of the touch control lines, and at least some of the first direction lines are connected to each other via a corresponding one of the second direction lines.

10. The display panel according to claim 9, wherein at least one of the first direction lines and at least one of the second direction lines are arranged at the periphery of each of the touch control lines.

11. The display panel according to claim 1, wherein orthographic projections of the touch control lines and the dummy lines onto the encapsulation layer are located within the spacing portions of the encapsulation layer.

12. The display panel according to claim 11, wherein a shape of a pattern formed by each of the touch control lines and dummy lines at the periphery of the touch control line corresponds to a shape of a corresponding one of the pixel opening portions.

13. The display panel according to claim 11, wherein the touch control lines and the dummy lines are provided at positions corresponding to at least 30% of all the spacing portions of the display panel.

14. The display panel according to claim 11, wherein each of the touch control blocks is of a grid structure, and comprises grid lines connected with each other, and a grid opening between the grid lines,
   wherein a position and a shape of the grid opening respectively correspond to a position and a shape of a corresponding one of the pixel opening portions.

15. The display panel according to claim 14, wherein at least some grid openings are larger in size than the pixel opening portions.

16. The display panel according to claim 14, wherein the grid structure is not provided with a grid line at at least part of positions where the grid structure overlaps the touch control lines.

17. A display device, comprising the display panel according to claim 1.

* * * * *